United States Patent [19]

Wilbarg et al.

[11] Patent Number: 5,296,408

[45] Date of Patent: Mar. 22, 1994

[54] FABRICATION METHOD FOR VACUUM MICROELECTRONIC DEVICES

[75] Inventors: Robert R. Wilbarg, Hopewell Junction; Claude Johnson, Jr., Yorktown, both of N.Y.

[73] Assignee: International Business Machines Corporation, Armonk, N.Y.

[21] Appl. No.: 996,460

[22] Filed: Dec. 24, 1992

[51] Int. Cl.$^5$ .......................................... H01L 21/441
[52] U.S. Cl. ............................. 437/203; 437/927; 148/DIG. 50
[58] Field of Search ............... 437/143, 199, 203, 247, 437/927; 148/DIG. 50, DIG. 73, DIG. 168

[56] References Cited

U.S. PATENT DOCUMENTS

| | | | |
|---|---|---|---|
| 4,870,029 | 9/1989 | Easter et al. | 148/DIG. 50 |
| 5,011,793 | 4/1991 | Obinata | 437/203 |
| 5,112,436 | 5/1992 | Bol | 156/662 |
| 5,203,731 | 4/1993 | Zimmerman | 437/927 |

FOREIGN PATENT DOCUMENTS 0281628  11/1990  Japan ..................... 437/203

Primary Examiner—Brian E. Hearn
Assistant Examiner—C. Chaudhari
Attorney, Agent, or Firm—Perman & Green

[57] ABSTRACT

A fabrication method for a microstructure having a vacuum sealed cavity therein including the process steps of forming an aluminum filled cavity in a body of silicon material and heating the structure such that the aluminum is absorbed into the silicon material leaving a vacuum in the cavity. In one embodiment of the invention a cavity is etched into a silicon wafer and filled with aluminum. A silicon dioxide layer is formed over the aluminum filled cavity and the structure is heated to produce the vacuum cavity.

5 Claims, 1 Drawing Sheet

FABRICATION METHOD FOR VACUUM MICROELECTRONIC DEVICES

FIELD OF THE INVENTION

The present invention relates to methods for fabricating micro-vacuum cavities in structures, and more particularly to a method for forming a micro-vacuum cavity in a silicon wafer.

BACKGROUND OF THE INVENTION

Microelectronic devices containing vacuum chambers or cavities are presently used for a number of applications including incandescent light sources, sensors, vacuum FET and vacuum tube on a chip device. The publication VACUUM-SEALED SILICON MICROMACHINED INCANDESCENT LIGHT SOURCE by C. H. Mastrangelo and R. S. Muller, IDEM 1989, pgs. 503-506 describes a vacuum-sealed silicon-filament incandescent light wherein a doped polysilicon filament wire with silicon nitride is enclosed in a vacuum sealed cavity with a silicon substrate. The cavity is an anisotropically-etched v-groove in the silicon substrate. A silicon nitride window over the V-groove hermetically seals the cavity after the filament is placed within.

The publications MICRO-DIAPHRAGM PRESSURE SENSOR by S. Sugiuam et al., IDEM 1986, pgs. 184-185 and FABRICATION TECHNIQUES FOR INTEGRATED SENSOR MICROSTRUCTURES by H. Guckel and D. W. Burns, IDEM 1986 pgs. 176-179 describe the use of vacuum cavities in micromechanical sensors wherein a cavity is etched in a silicon wafer, covered and sealed with a diaphragm and a vacuum is created in the cavity. In the publication THE COMEBACK OF THE VACUUM TUBE: SEMICONDUCTOR VERSIONS SUPPLEMENT TRANSISTORS? by Kathy Skidmore, Semiconductor International, August 1988, pgs. 15-17 a dielectric layer is etched to provide a cavity in which a metal emitter is located, a metal gate is formed above the emitter and a metal anode layer is fabricated over and seals the cavity, in which a vacuum is then created.

In all of the above devices and structures, the vacuum is created after the cavity is sealed by the application of an external vacuum pump. The external vacuum is typically produced in the fabrication process which seals the cavity (i.e. PECVD $SiO_2$) hence the vacuum in the cavity is contaminated by the gases used in the process and is only as low in pressure as that used in the process.

SUMMARY OF THE INVENTION

A fabrication method for a microstructure including a vacuum sealed cavity for use as a light source, a sensor, a transistor, vacuum tube on a chip or related device is provided wherein a cavity having a desired geometry is formed in a silicon wafer by etching.

A fabrication method for a microstructure having a vacuum sealed cavity is provided including the process step of filling the cavity with aluminum and overcoating for the later sealing of the aluminum filled cavity with an oxide or similar type layer.

A fabrication method for a microstructure having a vacuum sealed cavity is provided including the process step wherein a sealed cavity containing aluminum is heated on and the aluminum is absorbed into the structure to create a vacuum.

A fabrication method for microstructures having a vacuum seated cavity in a wafer is provided wherein the cavity can include filaments, transistor emitters and the like to provide a microelectronic device such as a light source sensor or the like.

BRIEF DESCRIPTION OF PREFERRED EMBODIMENTS

DESCRIPTION OF THE PREFERRED EMBODIMENTS

Figure 1A:
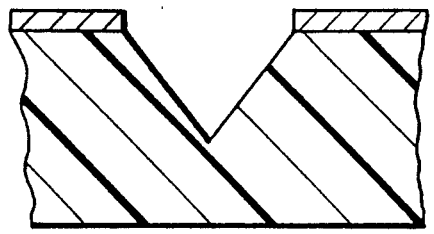
FIGS. 1A, 1B, 1C and 1D are schematic cross-sectional drawings illustrating various geometry cavities formed in a silicon wafer according to the principles of the present invention.
Figure 1B:
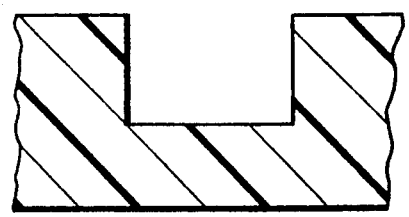
Figure 1C:
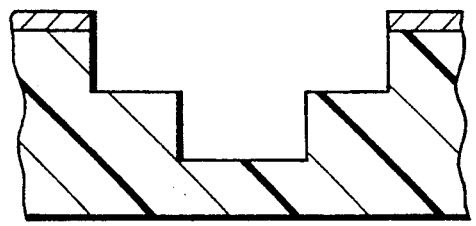
Figure 1D:
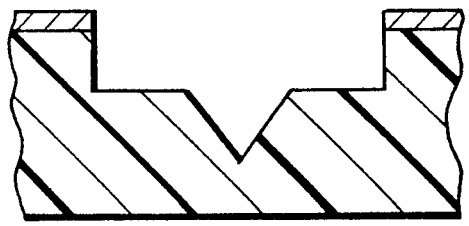

Referring to FIGS. 1A, 1B, 1C and 1D, some representative geometries or shapes of cavities formed in a silicon wafer are illustrated. In FIG. 1A, a silicon wafer 10 is optionally provided with a layer 12 composed of oxide or of a PECVD film deposited on the wafer 10 surface. The oxide or PECVD film is patterned in accordance with a desired cavity geometry and an etching step is carved out by either a conventional wet or dry etch to form a cavity. In FIG. 1B an alternative method is employed wherein the step of providing the oxide or PECVD layer is not used and the surface of the silicon wafer 10 is directly patterned and then etched for form a desired shaped cavity, such as illustrated in FIG. 1B. The structures illustrated in FIGS. 1C and 1D are shown to indicate that any desired configuration of cavity may be formed, depending on the ultimate application of the structure.

Figure 2A:
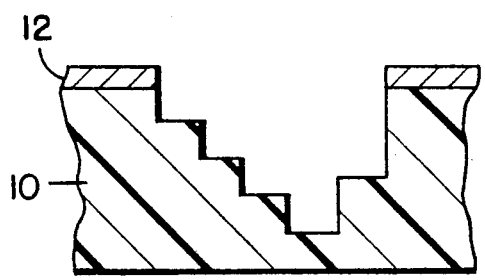
FIGS. 2A, 2B, 2C and 2D are schematic cross-sectional illustrations of the process for fabricating an aluminum filled cavity disposed in a silicon wafer and sealed with a layer of silicon.

FIGS. 2A illustrates a silicon wafer 10 having still another configuration of cavity form therein by etching.

Figure 2B:
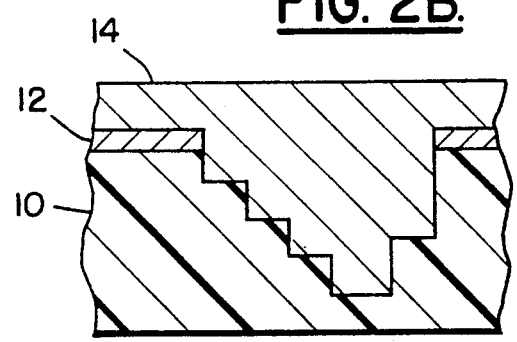
Figure 2C:
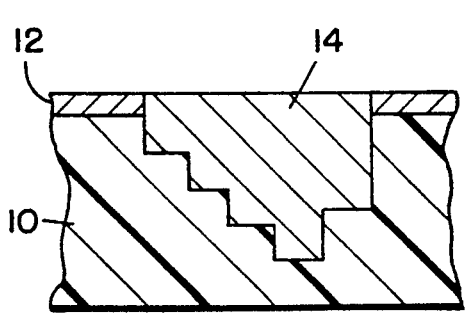

In accordance with the principles of the present invention, the structure of FIG. 2A is then covered by a layer 14 of aluminum which also fills the cavity as shown in FIG. 2B. The aluminum layer 14 is then planarized by known techniques available in the art to produce the configuration as shown in FIG. 2C, and their overcoated within a thin oxide film 16 as illustrated in FIG. 2D.

In FIGS. 2A, 2B, 2C and 2D the cavity is illustrated as not containing other structures such as filaments or emitters, but such elements may be included in the cavity prior to filling the cavity with the aluminum.

Figure 2D:
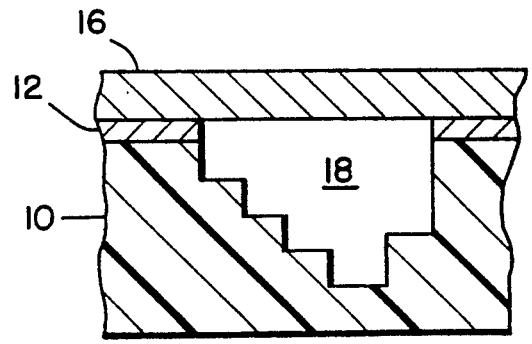

The oxide coated, aluminum filled cavity structure is next heated, that is, it is sintered at a temperature in excess of 525 degree centigrade which causes the aluminum in the cavity to become absorbed by the silicon wafer and thereby providing a vacuum cavity 18 as shown in FIG. 2D.

While the invention has been particularly shown and described with respect to a preferred embodiment thereof, it will be understood by those skilled in the art that changes in form and details may be made therein without departing form the scope and spirit of the invention. For example, instead of etching into the body of silicon to form a cavity which is then filled with aluminum, a quantity of aluminum may be disposed and patterned on a silicon material surface and silicon then deposited around the aluminum such that an aluminum filled cavity structure is produced. The structure is then heated and the aluminum is absorbed into the silicon to provide the vacuum.

What is claimed is:

1. A method for fabricating a microstructure incorporating a vacuum cavity therein comprising the steps of:

Step 1 forming a body of silicon material having an enclosed cavity therein filled with aluminum, Step 2 heating said body of silicon material containing said aluminum filled cavity to cause said aluminum in said cavity to be absorbed into said body of silicon material and leave a vacuum remaining in said cavity.

2. A method for fabricating a microstructure according to claim 1 wherein said Step 1 includes etching a cavity into the surface of a silicon wafer, filling said cavity with aluminum and then disposing an oxide layer over said silicon wafer surface and said aluminum filled cavity.

3. A method for fabricating a microstructure according to claim 2 wherein a thin layer of insulating material is disposed over said silicon wafer prior to said etching in Step 1.

4. A method for fabricating a microstructure according to claim 2 wherein a functional element is disposed in said cavity in said silicon wafer prior to filling said cavity with aluminum in Step 2.

5. A method for fabricating a microstructure according to claim 1 wherein Step 1 includes forming a body of aluminum on a silicon surface and disposing silicon material totally around said aluminum body.

* * * * *